(12) United States Patent
Ashihara et al.

(10) Patent No.: US 11,854,799 B2
(45) Date of Patent: Dec. 26, 2023

(54) METHOD OF MANUFACTURING SEMICONDUCTOR DEVICE, SUBSTRATE PROCESSING APPARATUS, AND NON-TRANSITORY COMPUTER-READABLE RECORDING MEDIUM

(71) Applicant: KOKUSAI ELECTRIC CORPORATION, Tokyo (JP)

(72) Inventors: Hiroshi Ashihara, Toyama (JP); Toshiyuki Kikuchi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 47 days.

(21) Appl. No.: 17/220,285

(22) Filed: Apr. 1, 2021

(65) Prior Publication Data

US 2021/0249256 A1  Aug. 12, 2021

Related U.S. Application Data

(63) Continuation of application No. 16/789,661, filed on Feb. 13, 2020, now Pat. No. 11,170,996.

(30) Foreign Application Priority Data

Mar. 15, 2019 (JP) .................................. 2019-048346

(51) Int. Cl.
| | |
|---|---|
| *H01L 21/02* | (2006.01) |
| *H01L 21/67* | (2006.01) |
| *C23C 16/46* | (2006.01) |
| *C23C 16/50* | (2006.01) |
| *C23C 16/448* | (2006.01) |
| *C23C 16/40* | (2006.01) |

(52) U.S. Cl.
CPC ........ *H01L 21/0228* (2013.01); *C23C 16/401* (2013.01); *C23C 16/4482* (2013.01); *C23C 16/46* (2013.01); *C23C 16/50* (2013.01); *H01L 21/02164* (2013.01); *H01L 21/67017* (2013.01)

(58) Field of Classification Search
None
See application file for complete search history.

(56) References Cited

U.S. PATENT DOCUMENTS

| | | |
|---|---|---|
| 8,263,502 B2 | 9/2012 | Lee |
| 2005/0170608 A1 | 8/2005 | Kiyotoshi et al. |

(Continued)

FOREIGN PATENT DOCUMENTS

| | | |
|---|---|---|
| CN | 101807524 A | 8/2010 |
| JP | 2005-150500 A | 6/2005 |

(Continued)

OTHER PUBLICATIONS

Apr. 16, 2021 Office Action issued in Korean Patent Application No. 10-2021-0017627.

(Continued)

*Primary Examiner* — Michelle Mandala
(74) *Attorney, Agent, or Firm* — Oliff PLC (57) ABSTRACT

A method of manufacturing a semiconductor device including: (a) loading a substrate into a process chamber; (b) supplying a processing gas including $H_2O$-containing radicals to the substrate; (c) supplying a gas including a halogen element; (d) supplying a gas including one or both of an oxygen element and a nitrogen element after (c); (e) repeating (c) and (d); and (f) repeating (b) and (e).

19 Claims, 8 Drawing Sheets

(56) References Cited

U.S. PATENT DOCUMENTS

| | | |
|---|---|---|
| 2005/0260347 A1 | 11/2005 | Narwankar et al. |
| 2010/0041179 A1 | 2/2010 | Lee |
| 2010/0210118 A1 | 8/2010 | Mizuno |
| 2014/0051261 A1 | 2/2014 | Ota et al. |
| 2014/0235068 A1 | 8/2014 | Ashihara et al. |
| 2014/0256157 A1 | 9/2014 | Sawada et al. |
| 2014/0315393 A1 | 10/2014 | Ozaki et al. |
| 2015/0104574 A1 | 4/2015 | Lee et al. |
| 2015/0111395 A1 | 4/2015 | Hashimoto et al. |
| 2015/0329965 A1 | 11/2015 | Gadgil et al. |
| 2019/0283093 A1 | 9/2019 | Son et al. |

FOREIGN PATENT DOCUMENTS

| | | | |
|---|---|---|---|
| JP | 2014-216342 A | 11/2014 | |
| JP | 2015-082525 A | 4/2015 | |
| JP | 2016-507001 A | 3/2016 | |
| JP | 2016-536452 A | 11/2016 | |
| JP | 2018-135603 A | 8/2018 | |
| JP | 2019-165080 A | 9/2019 | |
| KR | 10-2005-0048500 A | 5/2005 | |
| KR | 10-2007-0013337 A | 1/2007 | |
| KR | 10-2016-0045784 A | 4/2016 | |
| WO | 2012/128044 A1 | 9/2012 | |

OTHER PUBLICATIONS

Feb. 24, 2021 Office Action issued in Taiwanese Patent Application No. 109104427.
Dec. 18, 2012 Office Action issued in Korean Patent Application No. 10-2019-0172714.
Apr. 8, 2023 Office Action issued in Chinese Patent Application No. 202010091381.4.

|  | $H_2O$ | $H_2O$ RADICALS | $H_2O_2$ |
|---|---|---|---|
| LIFETIME OF ACTIVE SPECIES | ○ | ○ | ○ |
| OXIDIZING POWER AT LOW TEMPERATURE | △ | ◎ | ○ |
| COVERAGE | ◎ | ○ | ○ |
| CONTROLLABILITY OF STRENGTH | △ | ○ | △ |
| GENERATION METHOD | ◎ | ○ | × |

US 11,854,799 B2

METHOD OF MANUFACTURING SEMICONDUCTOR DEVICE, SUBSTRATE PROCESSING APPARATUS, AND NON-TRANSITORY COMPUTER-READABLE RECORDING MEDIUM

This is a Continuation of application Ser. No. 16/789,661 filed Feb. 13, 2020, which claims the benefit of Japanese Application No. 2019-048346 filed Mar. 15, 2019. The disclosures of the prior applications are hereby incorporated by reference herein in their entireties.

BACKGROUND

(1) Technical Field

The present disclosure relates to a method of manufacturing a semiconductor device, a substrate processing apparatus, and a non-transitory computer-readable recording medium.

(2) Description of the Related Art

As one of processes in a manufacturing process of a semiconductor device, performed is a process of forming a film such as a silicon oxide film (SiO film) on a substrate by performing a cycle the predetermined number of times after pretreating a surface of the substrate by supplying an oxygen ($O_2$) gas and a hydrogen ($H_2$) gas to the substrate, the cycle including: supplying a precursor gas to the substrate; and supplying a reactant gas to the substrate.

SUMMARY

A processing gas including an amino ligand has a low heat-resistant temperature and may be decomposed at a high temperature. Therefore, it is necessary to lower a processing temperature in order to form a film with high step coverage on a substrate having a high aspect ratio using a processing gas including the amino ligand. Further, it is necessary for oxidizing species to have high energy in order to form a high-quality film at a low temperature. However, when an oxygen plasma is used, the plasma cannot reach a bottom of the high aspect ratio, and when ozone ($O_3$) is used, $O_3$ becomes inactive due to collision with a wall, and therefore it has been difficult to form a high-quality film at a low temperature.

According to one or more embodiments of the present disclosure, there is provided a technique capable of forming a high-quality film at a low temperature by improving adsorptive of a halogen-based precursor.

According to one aspect of the present disclosure, there is provided a technique, which includes:
 (a) loading a substrate into a process chamber;
 (b) supplying a processing gas including $H_2O$-containing radicals to the substrate;
 (c) supplying a gas including a halogen element;
 (d) supplying a gas including one or both of an oxygen element and a nitrogen element after (c); and
 (e) repeating (c) and (d).

According to the present disclosure, it is possible to form a high-quality film at a low temperature by improving adsorptive of a halogen-based precursor.

DETAILED DESCRIPTION OF THE PREFERRED EMBODIMENTS

Embodiments of Present Disclosure

Hereinafter, some embodiments of the present disclosure will be described with reference to FIGS. 1 to 6C.

(1) Configuration of Substrate Processing Apparatus

Figure 1:
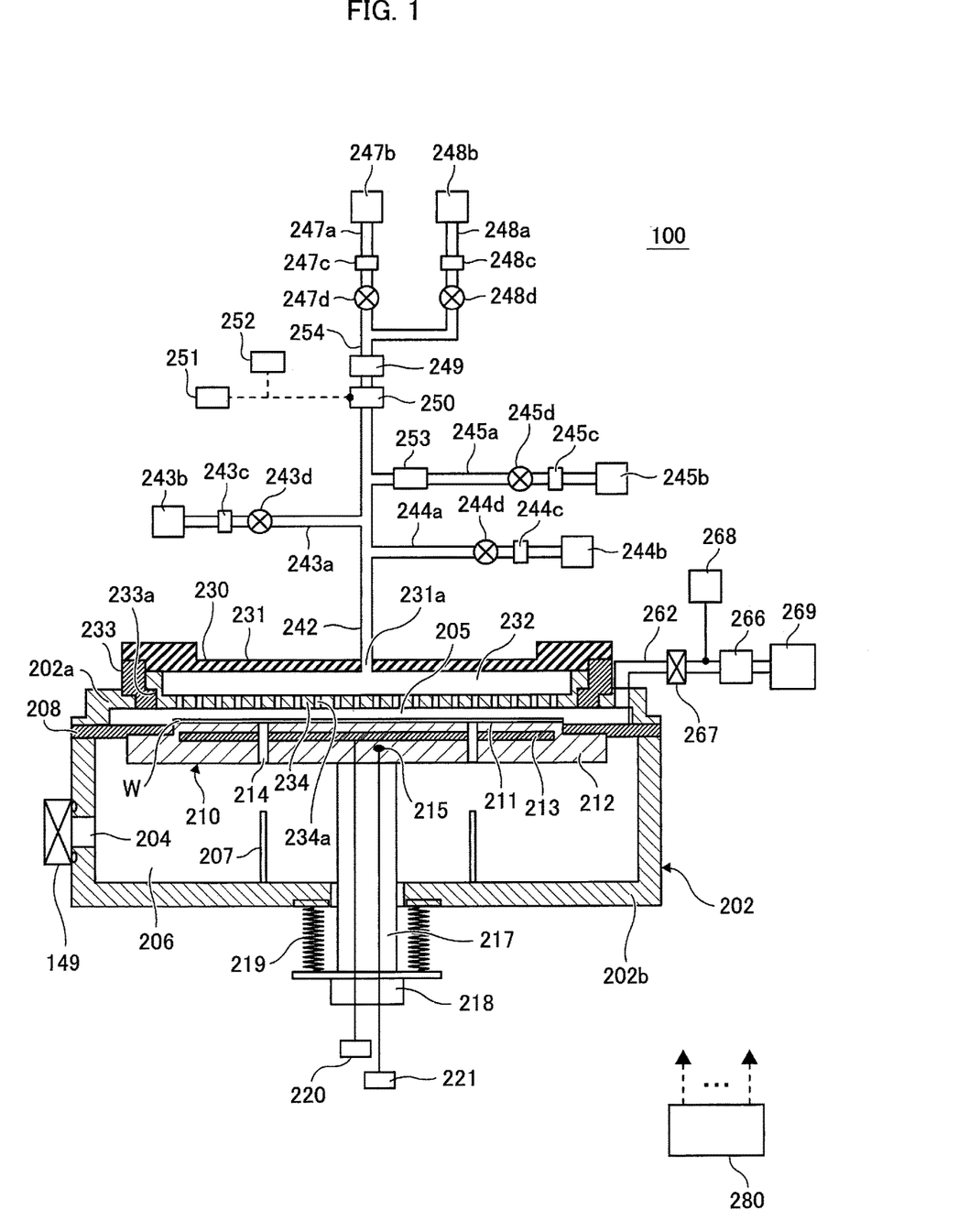
FIG. 1 is a schematic configuration diagram of a substrate processing apparatus suitably used in some embodiments of the present disclosure, and is a diagram illustrating a processing furnace portion in a vertical cross-sectional view.

As illustrated in FIG. 1, a substrate processing apparatus 100 includes a process container 202. The process container 202 is, for example, configured as a flat closed container having a circular cross section. The process container 202 is made of a metal material, for example, aluminum (Al), stainless steel (SUS), and the like. A process space 205 for processing a wafer W and a transfer space 206 through which the wafer W passes when the wafer W is transferred to the process space 205 are formed in a process container 202 which is a process chamber. The process container 202 is configured by an upper container 202a and a lower container 202b. A partition plate 208 is provided between the upper container 202a and the lower container 202b.

A substrate loading/unloading port 204 adjacent to a gate valve 149 is provided on a side surface of the lower container 202b, and the wafer W moves to and from a transfer chamber (not illustrated) through the substrate loading/unloading port 204. A plurality of lift pins 207 are provided at a bottom of the lower container 202b.

In the process space 205, a substrate support 210 that supports the wafer W is disposed. The substrate support 210 mainly includes a substrate mounting surface 211 on which the wafer W is mounted, a substrate mounting stand 212 including the substrate mounting surface 211 on a surface thereof, and a heater 213 as a heating source provided in the substrate mounting stand 212. In the substrate mounting stand 212, through-holes 214 through which the lift pins 207 pass are provided at positions corresponding to the lift pins 207 respectively. The heater 213 is connected to a heating controller 220 for executing a control so as to heat the heater 213 to a desired temperature by an instruction from a controller 280.

The substrate mounting stand 212 is supported by a shaft 217. The shaft 217 penetrates a bottom of the process container 202. Furthermore, the shaft 217 is connected to an elevation mechanism 218 outside the process container 202.

The elevation mechanism 218 mainly includes a support shaft for supporting the shaft 217 and an operating system for elevating or rotating the support shaft. The operating system includes, for example, an elevation mechanism including a motor for realizing elevation, and a rotating mechanism such as a gear for rotating the support shaft.

By operating the elevation mechanism 218 to elevate the shaft 217 and the substrate mounting stand 212, the substrate mounting stand 212 may elevate the wafer W mounted on the substrate mounting surface 211. A periphery of a lower end of the shaft 217 is covered with a bellows 219, so that an inside of the process space 205 is kept airtight.

The substrate mounting stand 212 moves down to reach a position where the substrate mounting surface 211 faces the substrate loading/unloading port 204 when the wafer W is transferred, and moves up until the wafer W reaches a process position in the process space 205 when the wafer W is processed, as illustrated in FIG. 1.

A shower head 230 as a gas dispersion mechanism is provided above (at upstream side of) the process space 205. A lid 231 of the shower head 230 is provided with a gas introduction hole 231a. The gas introduction hole 231a communicates with a gas supply pipe 242 described later.

The shower head 230 includes a dispersion plate 234 as a dispersion mechanism for dispersing the gas. An upstream side of the dispersion plate 234 is a buffer space 232, and a downstream side of the dispersion plate 234 is the process space 205. The dispersion plate 234 is provided with a plurality of through-holes 234a. The dispersion plate 234 is disposed so as to face the substrate mounting surface 211. The dispersion plate 234 is formed, for example, in a disk shape. The through-holes 234a are provided over the entire surface of the dispersion plate 234.

The upper container 202a has a flange, and a support block 233 is placed and fixed on the flange. The support block 233 has a flange 233a, and the dispersion plate 234 is placed and fixed on the flange 233a. Further, the lid 231 is fixed to an upper surface of the support block 233.

(Processing Gas Supply System)

The gas supply pipe 242 is connected to the lid 231 so as to communicate with the gas introduction hole 231a provided in the lid 231 of the shower head 230. A first gas supply pipe 243a, a second gas supply pipe 244a, a third gas supply pipe 245a, and a fourth gas supply pipe 254 are connected to the gas supply pipe 242.

(First Gas Supply System)

The first gas supply pipe 243a is provided with a first gas supply source 243b, a mass flow controller (MFC) 243c serving as a flow rate controller, and a valve 243d serving as an on-off valve in order from an upstream side.

A precursor gas containing a predetermined element and a halogen element, that is, a precursor gas containing silicon (Si) as the predetermined element and chlorine (Cl) as the halogen element, for example, tetrachlorosilane (SiCl$_4$) gas is supplied from the first gas supply pipe 243a to the process space 205 via the MFC 243c, the valve 243d, the gas supply pipe 242, the gas introduction hole 231a, the buffer space 232, and the through-holes 234a.

A first gas supply system (also referred to as a precursor gas supply system) is mainly configured by the first gas supply pipe 243a, the MFC 243c, and the valve 243d. The first gas supply source 243b may be included in the first gas supply system.

(Second Gas Supply System)

The second gas supply pipe 244a is provided with a second gas supply source 244b, an MFC 244c, and a valve 244d in order from an upstream side.

For example, an ozone (O$_3$) gas as a gas containing an oxygen element (oxygen-containing gas) is supplied from the second gas supply pipe 244a to the process space 205 via the MFC 244c, the valve 244d, the gas supply pipe 242, the gas introduction hole 231a, the buffer space 232, and the through-holes 234a.

A second gas supply system (also referred to as an oxidizing gas supply system or a reactant gas supply system) is mainly configured by the second gas supply pipe 244a, the MFC 244c, and the valve 244d. The second gas supply source 244b may be included in the second gas supply system.

(Third Gas Supply System)

The third gas supply pipe 245a is provided with an inert gas supply source 245b, an MFC 245c, a valve 245d, and a gas heating device 253 in order from an upstream side. The gas heating device 253 is not an essential component and is provided according to contents of the processing.

The gas heating device 253 heats an inert gas flowing through the third gas supply pipe 245a. A pipe heater may be provided in the gas supply pipe on the downstream side of the gas heating device 253. As the pipe heater, for example, a tape heater or a jacket heater coiling around the pipe may be used. A heat source of the gas heating device 253 may be a heater having a heating efficiency higher than that of the pipe heater, and may be, for example, a lamp heater.

For example, N$_2$ gas as the inert gas is supplied from the third gas supply pipe 245a to the process space 205 via the MFC 245c, the valve 245d, the gas heating device 253, the gas supply pipe 242, the gas introduction hole 231a, the buffer space 232, and the through-holes 234a.

A third gas supply system (also referred to as an inert gas supply system) is mainly configured by the third gas supply pipe 245a, the MFC 245c, the valve 245d, and the gas heating device 253. The inert gas supply source 245b may be included in the third gas supply system.

The N$_2$ gas supplied from the inert gas supply source 245b also acts as a purge gas for purging gas remaining in the process container 202 and the shower head 230 in a substrate processing process.

(Fourth Gas Supply System)

The fourth gas supply pipe 254 is connected to at least a gas supply pipe 248a, and is provided, at a downstream side, with a vaporizer 249 and a plasma generator 250 as a plasma generation member in order from an upstream side. A gas supply pipe 247a may be connected to the fourth gas supply pipe 254.

The gas supply pipe 247a is provided with a gas supply source 247b, an MFC 247c, and a valve 247d in order from an upstream side.

The gas supply pipe 248a is provided with a gas supply source 248b, an MFC 248c, and a valve 248d in order from an upstream side.

The vaporizer 249 is configured by a bubbler for bubbling a liquid source, and vaporizes the liquid source to generate a processing gas. Specifically, for example, water ($H_2O$) as a liquid source stored in the bubbler is bubbled by, for example, an oxygen ($O_2$) gas as a gas containing an oxygen element (oxygen-containing gas) supplied from the fourth gas supply pipe 254, whereby a gas containing $H_2O$ ($H_2O$-containing gas) is generated.

The $O_2$ gas is supplied from the gas supply pipe 248a to the fourth gas supply pipe 254 via the MFC 248c and the valve 248d.

In a case where the vaporizer 249 is configured not by the bubbler but by a combustion member, the vaporizer 249 is configured in a way that, for example, a hydrogen ($H_2$) gas as a gas containing a hydrogen element (hydrogen-containing gas) and an $O_2$ gas are supplied to the vaporizer 249. In the combustion member, the $H_2O$-containing gas is generated by heating the $H_2$ gas and the $O_2$ gas (reaction in a high temperature environment).

In this case, the gas supply pipe 247a for supplying the $H_2$ gas and a gas supply pipe 248a for supplying the $O_2$ gas are connected to the fourth gas supply pipe 254 connected to the vaporizer 249.

The $H_2$ gas is supplied from the gas supply pipe 247a to the fourth gas supply pipe 254 via the MFC 247c and the valve 247d.

The plasma generator 250 is connected to a plasma controller 251 that supplies power to the plasma generator 250. A plasma monitor 252 is connected between the plasma generator 250 and the plasma controller 251. The plasma monitor 252 detects a reflected wave or the like when the power is supplied to the plasma generator 250, and monitors a state of the plasma generator 250. The plasma generator 250 performs a plasma excitation on the $H_2O$-containing gas generated by the vaporizer 249 to generate radicals containing $H_2O$ ($H_2O$-containing radicals) which is an $H_2O$-containing gas in a plasma state.

That is, the processing gas including the $H_2O$-containing radicals is supplied from the fourth gas supply pipe 254. A gas containing an OH group and generated by reacting the $H_2$ gas and the $O_2$ gas in the high temperature environment may be supplied.

Then, a processing gas including the $H_2O$-containing radicals is supplied from the fourth gas supply pipe 254 to the process space 205 via the gas supply pipe 242, the gas introduction hole 231a, the buffer space 232, and the through-holes 234a.

A fourth gas supply system (also referred to as a hydrophilizing gas supply system) is mainly configured by the fourth gas supply pipe 254, the gas supply pipe 248a, the MFC 248c, the valve 248d, the vaporizer 249, and the plasma generator 250. The gas supply pipe 247a, the MFC 247c, and the valve 247d may be included in the fourth gas supply system. Further, the gas supply sources 247b and 248b may be included in the fourth gas supply system.

(Exhaust System)

An exhaust system for exhausting an atmosphere of the process container 202 will be described. An exhaust pipe 262 is connected to the process container 202 so as to communicate with the process space 205. The exhaust pipe 262 is provided laterally to the process space 205. The exhaust pipe 262 is provided with an auto pressure controller (APC) 266 that is a pressure controller that controls an internal pressure of the process space 205 to be a predetermined pressure. The APC 266 includes a valve body (not illustrated) whose degree of valve opening can be adjusted, and adjusts a conductance of the exhaust pipe 262 in accordance with an instruction from the controller 280. A valve 267 is provided on the exhaust pipe 262 at an upstream side of the APC 266. A pressure monitor 268 that measures a pressure of the exhaust pipe 262 is provided at a downstream side of the valve 267.

The pressure monitor 268 monitors a pressure of the exhaust pipe 262. Since the exhaust pipe 262 is in communication with the process space 205, the pressure in the process space 205 is indirectly monitored. The pressure monitor 268 is electrically connected to the controller 280 and transmits detected pressure data to the controller 280.

The exhaust pipe 262, the pressure monitor 268, the valve 267, and the APC 266 are collectively called an exhaust system. Further, a vacuum pump 269 is provided. As illustrated, the vacuum pump 269 vacuum-exhausts the atmosphere in the process space 205 via the exhaust pipe 262.

(Controller)

The substrate processing apparatus 100 includes a controller 280 that controls an operation of each unit of the substrate processing apparatus 100.

Figure 2:
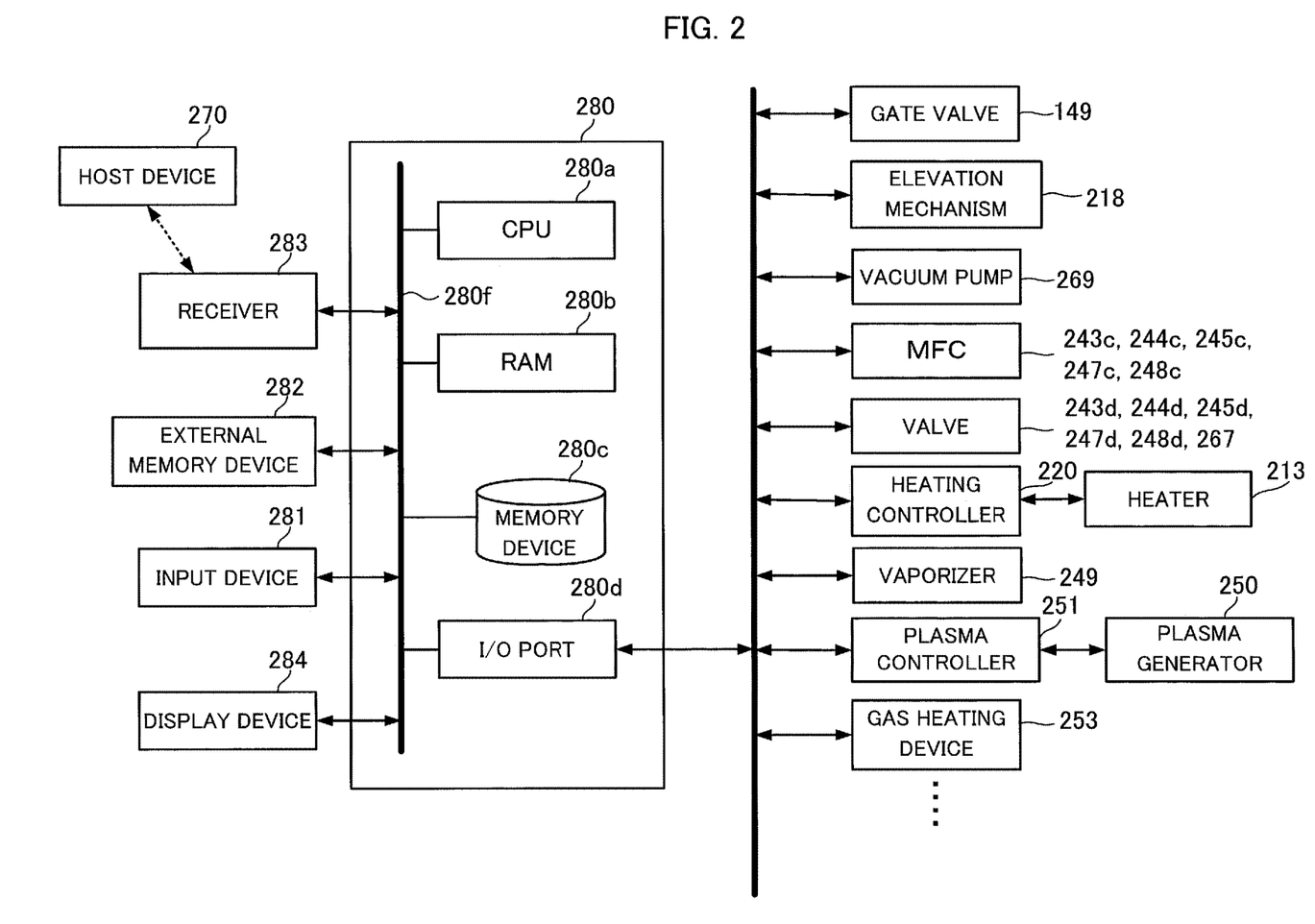
FIG. 2 is a schematic configuration diagram of a controller of a substrate processing apparatus suitably used in some embodiments of the present disclosure, and is a diagram illustrating a control system of the controller in a block diagram.

FIG. 2 illustrates an outline of the controller 280. The controller 280, which is a controller, is configured as a computer including a central processing unit (CPU) 280a, a random access memory (RAM) 280b, a memory device 280c as a storage, and an I/O port 280d. The RAM 280b, the memory device 280c, and the I/O port 280d are configured to be able to exchange data with the CPU 280a via an internal bus 280f.

The controller 280 is configured to be connectable to an input device 281 configured as, for example, a keyboard or the like, or an external memory device 282. Further, a receiver 283 connected to a host device 270 via a network is provided.

The display device 284 displays data and the like detected by each monitor. In some embodiments, the display device 284 is described as a component separate from the input device 281, but the present disclosure is not limited thereto. For example, when the input device also functions as a display screen such as a touch panel, the input device 281 and the display device 284 may be one component.

The memory device 280c is configured by, for example, a flash memory, a hard disk drive (HDD), and the like. In the memory device 280c, a process recipe in which a procedure, conditions, and the like of a substrate processing described later are described, a recipe program as a control program for controlling an operation of a substrate processing apparatus for realizing the same, a table described later, and the like are stored in a readable manner. The recipe program is a program that is combined so that the controller 280 can execute each procedure in the substrate processing process described later and obtain a predetermined result, and functions as a program. Hereinafter, the recipe program, the control program, and the like are collectively referred to as a program simply. In the present specification, the term program may simply include a process recipe, may simply include a control program, or may include both. The RAM 280b is configured as a memory area (work area) in which programs, data, and the like read by the CPU 280a are temporarily stored.

The I/O port 280d is connected to the respective components of the substrate processing apparatus 100, such as the gate valve 149, the elevation mechanism 218, the vacuum pump 269, the MFCs 243c, 244c, 245c, 247c, and 248c, the valves 243d, 244d, 245d, 247d, 248d, and 267, the heating controller 220, the vaporizer 249, the plasma controller 251, and the gas heating device 253.

The CPU 280a is configured to read and execute a control program from the memory device 280c, and read a recipe program from the memory device 280c in response to input of an operation command from the input device 281 and the like. Then, the CPU 280a is configured to control an opening/closing operation of the gate valve 149, an elevation operation of the elevation mechanism. 218, an on/off control of the vacuum pump 269, a flow rate adjustment operation of the MFCs 243c, 244c, 245c, 247c, and 248c, an opening/closing operation of the valves 243d, 244d, 245d, 247d, 248d, and 267, a temperature control of a heater 213 by the heating controller 220, an operation of the vaporizer 249, an operation of the plasma generator 250 by the plasma controller 251, a temperature control of the gas heating device 253, and the like according to the contents of the read recipe program.

The controller 280 according to some embodiments can be configured by installing the program into the computer using an external memory device (for example, a magnetic disk such as a hard disk, an optical disk such as a DVD, a magneto-optical disk such as an MO, or a semiconductor memory such as a USB memory) 282 that stores the above-described program. A way of supplying the program to the computer is not limited to a case where the program is supplied via the external memory device 282. For example, the program may be supplied, without using the external memory device 282, using a communication tool such as the Internet or a dedicated line. The memory device 280c and the external memory device 282 are configured as a computer-readable recording medium. Hereinafter, these are collectively referred to as a recording medium simply. In the present specification, the term recording medium may simply include the memory device 280c, may simply include the external memory device 282, or may include both.

(2) Substrate Processing Process

Next, an example of a method of performing a process of forming a thin film on the substrate as one of processes of manufacturing a semiconductor device (device) using the substrate processing apparatus 100 will be described. In the following description, operations of respective units configuring the substrate processing apparatus 100 are controlled by the controller 280.

Hereinafter, the substrate processing process of some embodiments will be specifically described with reference to FIGS. 3 to 6C.

Figure 3:
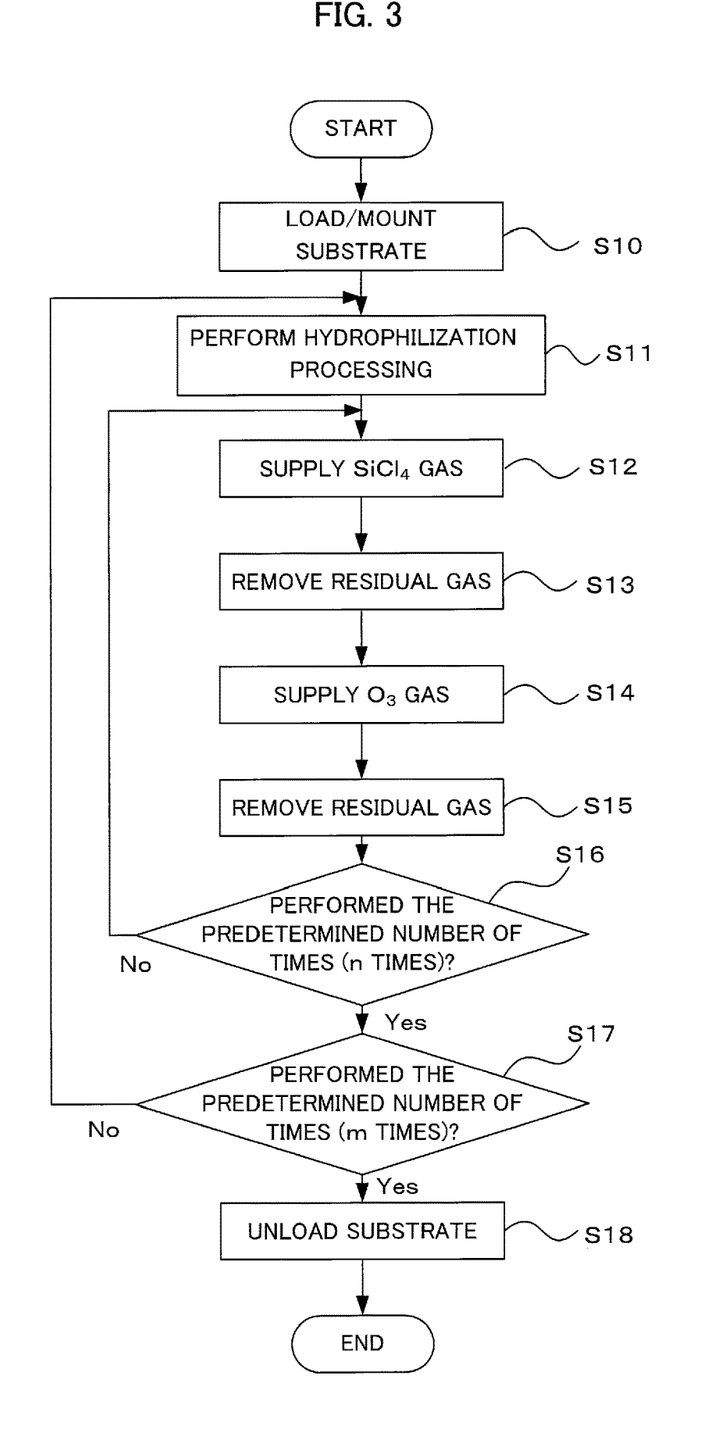
FIG. 3 is a flowchart illustrating a process of substrate processing according to some embodiments of the present disclosure.

Here, an example of forming a silicon oxide film ($SiO_2$ film, hereinafter also referred to as a SiO film) of a predetermined film thickness on the wafer 200 by performing a substrate processing process will be described, the substrate processing process including:

(a) loading a wafer W into a process container 202;
(b) supplying a processing gas including $H_2O$-containing radicals to the wafer W;
(c) supplying a $SiCl_4$ gas as a gas containing a halogen element;
(d) supplying an $O_3$ gas as a gas containing one or both of an oxygen element and a nitrogen element after (c); and
(e) repeating (c) and (d).

In the above-described (b), a process of supplying a processing gas including $H_2O$-containing radicals to the wafer W and a process of supplying $N_2$ gas as an inert gas are repeatedly performed to form an OH-terminated surface of a silicon layer (underlying Si) on a surface of the wafer W. As a result, a Si precursor in the $SiCl_4$ gas in the subsequent (c) is easily adsorbed on the surface of the wafer W, and the processing gas is uniformly adsorbed on the surface of the wafer W having a high aspect ratio, so that the SiO film can be formed uniformly.

In the present specification, the term "wafer" may mean "a wafer itself" or "a laminate (assembly) of a wafer and predetermined layers, films, or the like formed on the surface of the wafer" (that is, the laminate including predetermined layers, films, and the like formed on the surface is referred to as the wafer). Further, in the present specification, the term "surface of the wafer" may mean "a surface of a wafer itself (exposed surface)" or "a surface of a predetermined layer, film, or the like formed on a wafer, that is, an outermost surface of a wafer as a laminate."

Therefore, in the present specification, the description "supply a predetermined gas to a wafer" may mean "supply a predetermined gas directly to a surface (exposed surface) of a wafer itself" or mean "supply a predetermined gas to a layer, a film, or the like formed on a wafer, that is, to an outermost surface of a wafer as a laminate." In addition, in the present specification, the description "a predetermined layer (or film) is formed on a wafer" may mean "a predetermined layer (or film) is directly formed on a surface (exposed surface) of a wafer itself" or mean "a predetermined layer (or film) is formed on a layer, a film, or the like formed on a wafer, that is, on an outermost surface of a wafer as a laminate."

In the present specification, the term "substrate" is the same as the term "wafer," and in this case, the "wafer" may be replaced with the "substrate" in the above-described description.

(Substrate Loading/Mounting Process: Step S10)

In the substrate processing apparatus 100, the substrate mounting stand 212 is lowered to a transfer position of the wafer W, whereby the lift pins 207 pass through the through-holes 214 of the substrate mounting stand 212. As a result, the lift pins 207 project from a surface of the substrate mounting stand 212 by the predetermined height. Subsequently, the gate valve 149 is opened, the wafer W (processing substrate) is loaded into a process chamber by using a wafer transfer device (not illustrated), and the wafer W is transferred onto the lift pins 207. Thus, the wafer W is supported in a horizontal posture on the lift pins 207 protruding from the surface of the substrate mounting stand 212.

When the wafer W is loaded into the process container 202, the wafer transfer device is retracted out of the process container 202, such that the gate valve 149 is closed to seal an inside of the process container 202. Thereafter, the wafer W is mounted on the substrate mounting surface 211 provided on the substrate mounting stand 212 by raising the substrate mounting stand 212.

When the wafer W is loaded into the process container 202, which is a process chamber where the wafer W is processed, it is preferable to supply the $N_2$ gas as the inert gas into the process container 202 from the inert gas supply system while exhausting an inside of the process container 202 by an exhaust system. That is, it is preferable to open at least the valve 245d of the inert gas supply system to supply the $N_2$ gas into the process container 202 while exhausting the inside of the process container 202 by operating the vacuum pump 269 to open the valve 267 and the APC 266. Thus, this makes it possible to suppress intrusion of particles into the process container 202 and adhesion of particles onto the wafer W. Further, the vacuum pump 269 is always operated at least from the substrate loading/mounting process (S10) to an end of a substrate unloading process (S17) described later.

When the wafer W is mounted on the substrate mounting stand 212, electric power is supplied to the heater 213 embedded in the substrate mounting stand 212, and the surface of the wafer W is controlled to a predetermined temperature. At this time, a temperature of the heater 213 is adjusted by controlling a condition of the power supply to the heater 213 based on temperature information detected by a temperature sensor (not illustrated).

(Hydrophilization Processing: Step S11)

Figure 5A:
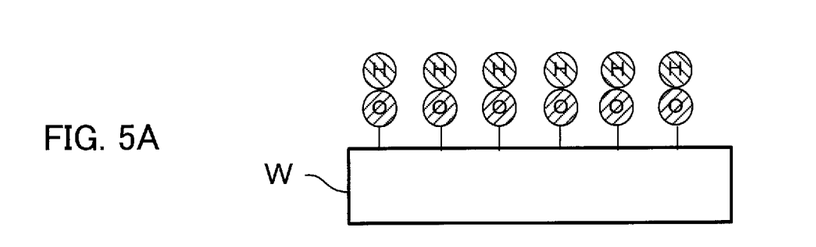
FIG. 5A is a view for describing a state of a wafer surface after a hydrophilization processing.

Subsequently, a hydrophilization processing (S11) is performed. By performing the hydrophilization processing on the wafer W, an OH group is attached to the surface of the wafer W, and an OH termination is formed on the surface of the wafer W, as illustrated in FIG. 5A. This hydrophilization processing is performed until the reaction is saturated by self-limiting and the OH group is adsorbed. Thus, this facilitates the adsorption of the Si precursor on the surface of the wafer W in the subsequent $SiCl_4$ gas supply (S12). The details of the hydrophilization processing process S11 will be described later.

[SiO Film Forming Process] ($SiCl_4$ Gas Supply: Step S12)

Subsequently, the valve 243d of the first gas supply pipe 243a is opened, and the $SiCl_4$ gas flows into the first gas supply pipe 243a. The $SiCl_4$ gas flows from the first gas supply pipe 243a, and a flow rate of the $SiCl_4$ gas is adjusted by the MFC 243c. The $SiCl_4$ gas adjusted in the flow rate is supplied into the process space 205 through the gas supply pipe 242, the gas introduction hole 231a, the buffer space 232, and the through-holes 234a, and is exhausted from the exhaust pipe 262.

At this time, the valve 245d of the third gas supply pipe 245a is opened, and the $N_2$ gas as the inert gas is supplied from the third gas supply pipe 245a. A flow rate of the $N_2$ gas is adjusted by the MFC 245c. The $N_2$ gas adjusted in the flow rate is supplied into the process space 205 through the gas supply pipe 242, the gas introduction hole 231a, the buffer space 232, and the through-holes 234a, and is exhausted from the exhaust pipe 262.

Figure 5B:
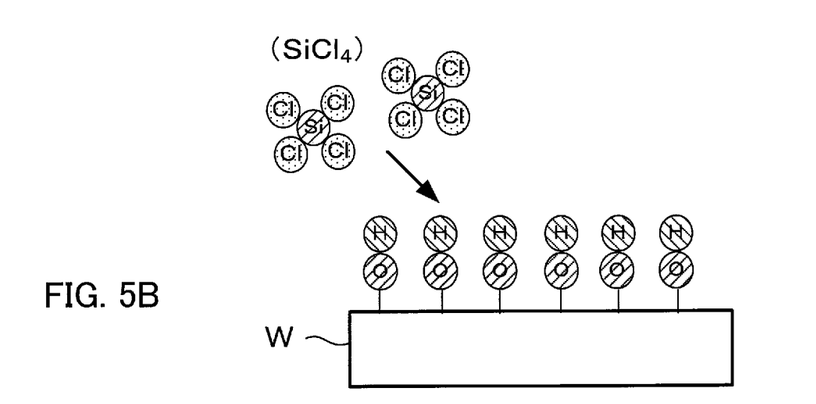
FIG. 5B is a view for describing a state of the wafer surface before exposure by supplying a $SiCl_4$ gas.
Figure 5C:
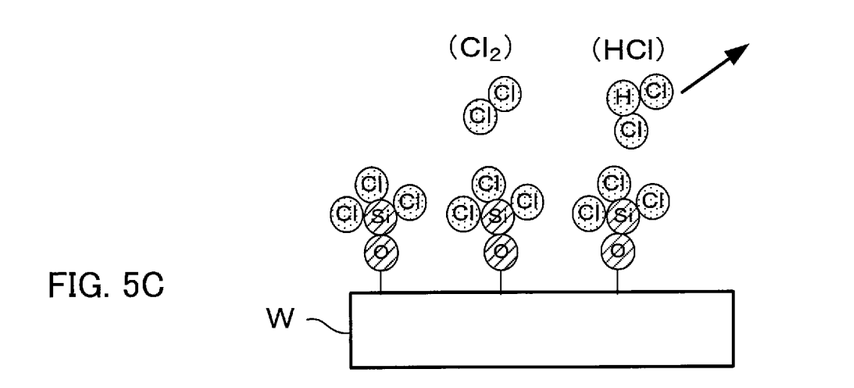
FIG. 5C is a view for describing a state of the wafer surface after exposure by supplying the $SiCl_4$ gas.

Specifically, as illustrated in FIG. 5B, when the $SiCl_4$ gas is supplied on the surface of the wafer W on which the OH termination is formed as illustrated in FIG. 5A, O—H bond of the surface of the wafer W is broken. Then, as illustrated in FIG. 5C, H whose bond with O has been broken is combined with Cl, and reaction by-products such as hydrogen chloride (HCl) and $Cl_2$ are generated. Then, the O left after the bond with the H is broken is bonded to Si, and a Si—O bond is formed. That is, a Si-containing layer containing Si, O, and Cl is formed.

In other words, the $SiCl_4$ gas is supplied to the wafer W, whereby the Si-containing layer containing Si, O, and Cl having a thickness of, for example, less than one atomic layer to several atomic layers is formed on the wafer W after the hydrophilization processing. The Si-containing layer may be a layer where the $SiCl_4$ gas is adsorbed, may be a Si layer, or may include both.

Here, the Si layer is a generic name including not only a continuous layer made of Si, but also a discontinuous layer and a Si thin film formed by overlapping these layers. The continuous layer made of Si may be referred to as the Si thin film. The Si configuring the Si layer also includes Si whose bond with Cl is not completely broken.

(Residual Gas Removal: Step S13)

After the Si-containing layer containing Si, O, and Cl is formed on the wafer W, the valve 243d of the first gas supply pipe 243a is closed, and the supply of the $SiCl_4$ gas is stopped. At this time, while the valve 267 and the APC 266 of the exhaust pipe 262 are kept open, the inside of the process space 205 is vacuum-exhausted by the vacuum pump 269, and the reaction by-products such as $SiCl_4$ gas, $Cl_2$, and HCl remaining in the process space 205 and remaining unreacted or having contributed to the formation of the Si-containing layer are removed from the inside of the process space 205 (residual gas removal). At this time, while the valve 245d is kept open, the supply of the $N_2$ gas as the inert gas into the process space 205 is maintained. The $N_2$ gas acts as a purge gas, whereby an effect of removing, from the inside of the process space 205, the reaction by-products such as $SiCl_4$ gas, $Cl_2$, and HCl remaining in the process space 205 and remaining unreacted or having contributed to the formation of the Si-containing layer can be enhanced.

($O_3$ Gas Supply: Step S14)

After removing the residual gas in the process space 205, the valve 244d of the second gas supply pipe 244a is opened, and an $O_3$ gas flows into the second gas supply pipe 244a. The $O_3$ gas flows from the second gas supply pipe 244a, and a flow rate of the $O_3$ gas is adjusted by the MFC 244c. The $O_3$ gas adjusted in the flow rate is supplied into the process space 205 via the second gas supply pipe 244a, the gas supply pipe 242, the gas introduction hole 231a, the buffer space 232, and the through-holes 234a, and is exhausted from the exhaust pipe 262.

At this time, while the valve 245d of the third gas supply pipe 245a is kept open, an $N_2$ gas as an inert gas is supplied from the third gas supply pipe 245a. A flow rate of the $N_2$ gas is adjusted by the MFC 245c. The $N_2$ gas adjusted in the flow rate is supplied into the process space 205 through the gas supply pipe 242, the gas introduction hole 231a, the buffer space 232, and the through-holes 234a, and is exhausted from the exhaust pipe 262.

Figure 6A:
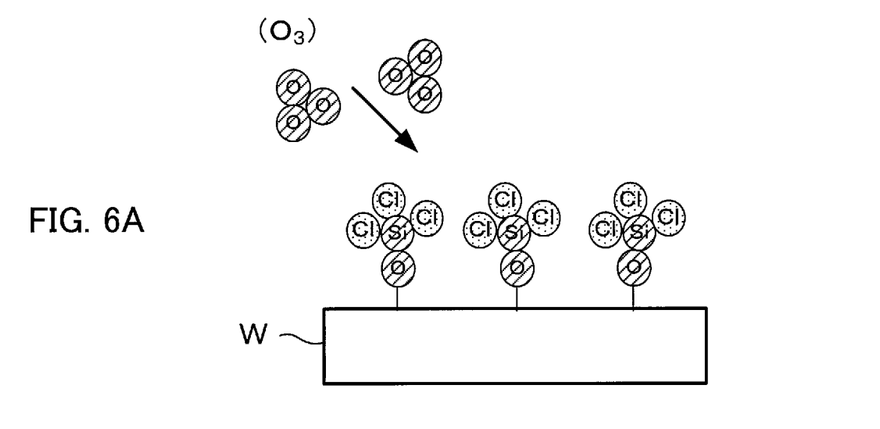
FIG. 6A is a view for describing a state of a wafer surface before exposure by supplying an $O_3$ gas.
Figure 6B:
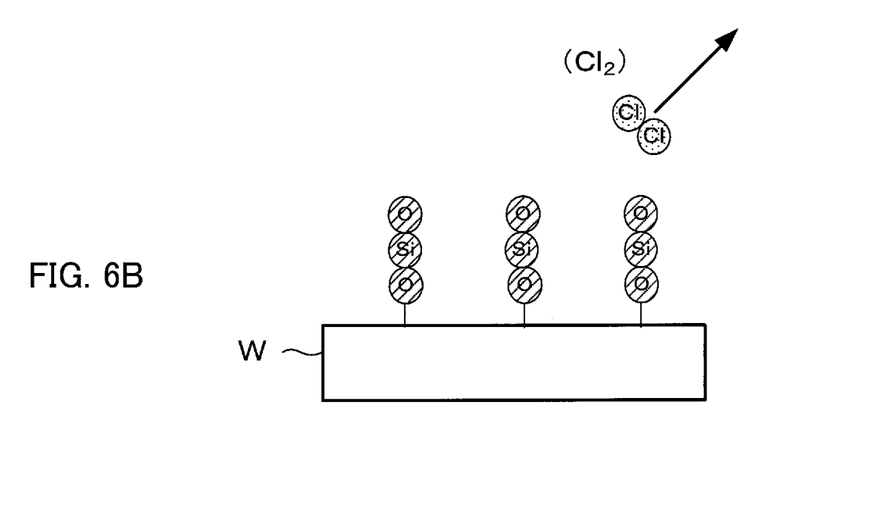
FIG. 6B is a view for describing a state of the wafer surface after exposure by supplying the $O_3$ gas.

By supplying the $O_3$ gas to the wafer W on which the Si-containing layer containing Si, O, and Cl is formed, the Si-containing layer formed on the wafer W is oxidized. Specifically, as illustrated in FIG. 6A, the $O_3$ gas is supplied to the wafer W on which the Si-containing layer containing Si, O, and Cl is formed, such that the state, the Si—Cl bond included in the Si-containing layer is broken as illustrated in FIG. 6B. The Cl whose bond with Si has been broken is removed from the film and discharged as $Cl_2$ or the like. Further, Si bonds left after the bond with Cl is broken are bonded with O included in oxidizing species to form a Si—O bond. In this way, the Si-containing layer is changed (modified) into a SiO layer having a low content of impurities such as Cl.

(Residual Gas Removal: Step S15)

After oxidizing the surface of the Si-containing layer on the surface of the wafer W to form the SiO layer, the valve 244d of the second gas supply pipe 244a is closed, and the supply of the $O_3$ gas is stopped. At this time, while the valve 267 and the APC 266 of the exhaust pipe 262 are kept open, the inside of the process space 205 is vacuum-exhausted by the vacuum pump 269, and the reaction by-products such as $O_3$ gas or $Cl_2$ remaining in the process space 205 and remaining unreacted or having contributed to the formation of the SiO layer are removed from the inside of the process space 205 (residual gas removal).

(Performing the Predetermined Number of Times: Step S16)

The above-described Steps S12 to S15 are defined as one cycle, and this cycle is repeated the predetermined number of times (n times), preferably a plurality of times, so that the SiO layer having a predetermined film thickness and a low content of impurities such as HCl and Cl is formed on the wafer W is formed.

(Performing the Predetermined Number of Times: Step S17)

Figure 6C:
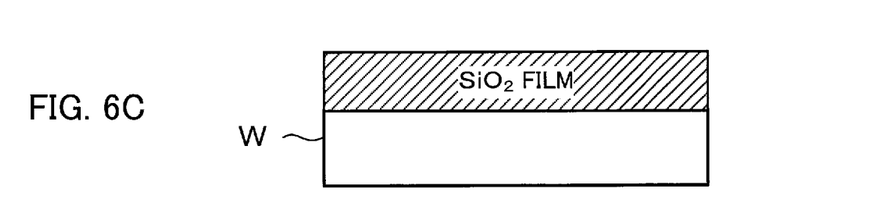
FIG. 6C is a view for describing a state in which a SiO film is formed on a wafer by the process of substrate processing.

After a cycle in which the above-described hydrophilization processing (S11) and the above-described SiO film forming process (S12 to S15) are sequentially performed is performed the predetermined number of times (n times), the hydrophilization processing and the SiO film forming process are performed the predetermined number of times (m times), whereby SiO film having a predetermined film thickness can be formed on the SiO layer formed on the surface of the wafer W, as illustrated in FIG. 6C. Further, the hydrophilization processing (S11) can be performed every time the SiO film forming process is performed the predetermined number of times (n times) as in this step, thereby improving a throughput.

After performing the hydrophilization processing and the SiO film forming process the predetermined number of times (m times) (after performing m times or more) as in this step, the above-described SiO film forming process (S12 to S15) can be repeated, thereby forming the SiO film having a predetermined film thickness. That is, the hydrophilization processing is performed until Si adsorption sites existing on the surface of the wafer W in the first m cycles are filled. Thus, this makes it possible to improve the adsorptive of the halogen-based precursor and form a high-quality film at a low temperature.

(Substrate Unloading Process: Step S18)

Subsequently, the substrate mounting stand 212 is lowered, and the wafer W is supported on the lift pins 207 protruding from the surface of the substrate mounting stand 212. Thereafter, the gate valve 149 is opened, and the wafer W is unloaded from the process container 202 using the wafer transfer device. Thereafter, when the substrate processing process is ended, the supply of the inert gas from the inert gas supply system into the process container 202 is stopped.

Subsequently, the hydrophilization processing (S11) will be described in detail with reference to FIG. 4.

($H_2O$-Containing Radical Supply: Step S20)

The valve 248d of the gas supply pipe 248a is opened, and the $O_2$ gas is supplied into the vaporizer 249 as a bubbler via the fourth gas supply pipe 254. The $O_2$ gas flows from the gas supply pipe 248a, and the flow rate of the $O_2$ gas is adjusted by the MFC 248c. The $O_2$ gas adjusted in the flow rate is supplied into the vaporizer 249 via the fourth gas supply pipe 254.

Then, the $O_2$ gas supplied to the vaporizer 249 as the bubbler bubbles $H_2O$ as a liquid source stored in the vaporizer 249 to generate the $H_2O$-containing gas.

When the vaporizer 249 is configured by a combustion member, the following operation is performed.

Specifically, the valves 247d and 248d of the gas supply pipes 247a and 248a are opened, and a mixed gas of the $H_2$ gas and the $O_2$ gas is supplied into the vaporizer 249 via the fourth gas supply pipe 254. The $H_2$ gas flows from the gas supply pipe 247a, and the flow rate of the $H_2$ gas is adjusted by the MFC 247c. The $H_2$ gas adjusted in the flow rate is supplied into the vaporizer 249 via the fourth gas supply pipe 254. Further, the $O_2$ gas flows from the gas supply pipe 248a, and the flow rate of the $O_2$ gas is adjusted by the MFC 248c. The $O_2$ gas adjusted in the flow rate is supplied into the vaporizer 249 via the fourth gas supply pipe 254. That is, a mixed gas of the $H_2$ gas and the $O_2$ gas is supplied to the vaporizer 249.

The mixed gas of the $H_2$ gas and the $O_2$ gas supplied into the vaporizer 249 reacts in the vaporizer 249 to generate the $H_2O$-containing gas.

Then, the $H_2O$-containing gas generated by the vaporizer 249 is supplied to the plasma generator 250. The $H_2O$-containing gas supplied to the plasma generator 250 is plasma-excited by the plasma generator 250 and activated by the plasma, and a processing gas including $H_2O$-containing radicals, which are active species having higher energy, is generated.

Then, the processing gas including the $H_2O$-containing radicals generated by the plasma generator 250 is supplied into the process space 205 through the gas supply pipe 242, the gas introduction hole 231a, the buffer chamber 237, and the through-holes 234a, and exhausted from the exhaust pipe 262. At this time, the processing gas including the $H_2O$-containing radicals is supplied to the wafer W.

(Inert Gas Supply: Step S21)

After the processing gas including the $H_2O$-containing radicals is supplied to the wafer W, the valve 248d (247d) of the gas supply pipe 248a (247a) is closed, and the supply of the $O_2$ gas (or the $H_2$ gas and the $O_2$ gas) is stopped. At this time, while the valve 267 and the APC 266 of the exhaust pipe 262 are kept open, the inside of the process space 205 is vacuum-exhausted by the vacuum pump 269, and the processing gas including the $H_2O$-containing radicals remaining in the process space 205 and remaining unreacted or having contributed to the formation of the OH group is removed from the inside of the process space 205 (residual gas removal). At this time, while the valve 245d is kept open, the supply of the $N_2$ gas as the inert gas into the process space 205 is maintained.

(Performing the Predetermined Number of Times: Step S22)

The above-described Steps S20 to S21 are defined as one cycle, and this cycle is repeated the predetermined number of times, preferably a plurality of times, such that the Si precursor included in the $SiCl_4$ gas in the supply of the $SiCl_4$ gas of the subsequent SiO film forming process is easily adsorbed on the surface of the wafer W, whereby the processing gas may be uniformly adsorbed on the surface of the wafer W having a high aspect ratio, thus forming the SiO film uniformly.

(3) Effects of the Above-Described Embodiments

According to the above-described embodiments, one or more effects described below can be obtained. (a) By supplying the processing gas including the $H_2O$-containing radicals and performing the hydrophilization processing (S11), it is possible to improve the adsorptive of the halogen-based precursor and form a high-quality film at a low temperature. (b) The processing gas can be uniformly adsorbed on the surface of the wafer having the high aspect ratio to form a uniform film. That is, the processing gas can be uniformly adsorbed from a bottom to a top with the high aspect ratio. (c) By performing the hydrophilization processing (S11) every time the SiO film forming process is performed the predetermined number of times, it is possible to improve the throughput. (d) The above-described effects can be obtained similarly when a precursor gas other than the $SiCl_4$ gas is used, when a reactant gas other than the $O_3$ gas is used, or when an inert gas other than the $N_2$ gas is used.

Modification

Figure 7:
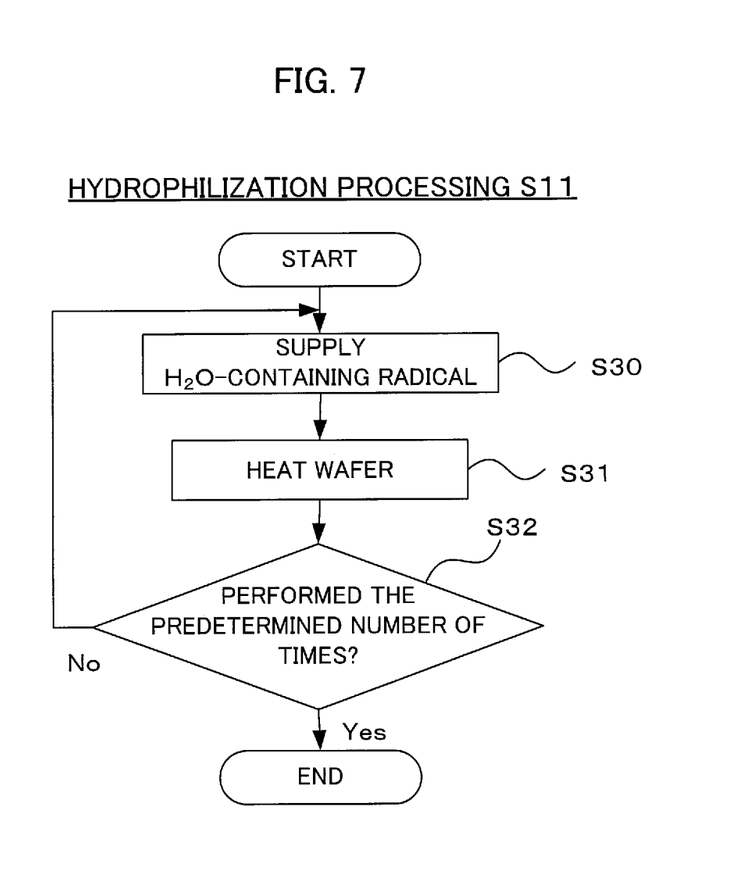
FIG. 7 is a flowchart illustrating a modification of the hydrophilization processing according to an embodiment of the present disclosure.

Next, a modification of the hydrophilization processing (S11) in the above-described embodiments will be described with reference to FIG. 7.

($H_2O$-Containing Radical Supply: Step S30)

Since this step is the same as the $H_2O$-containing radical supply (S20) in the hydrophilization processing (S11) described in detail with reference to FIG. 4 described above, the description of this step will be omitted.

(Wafer Heating: Step S31)

Figure 4:
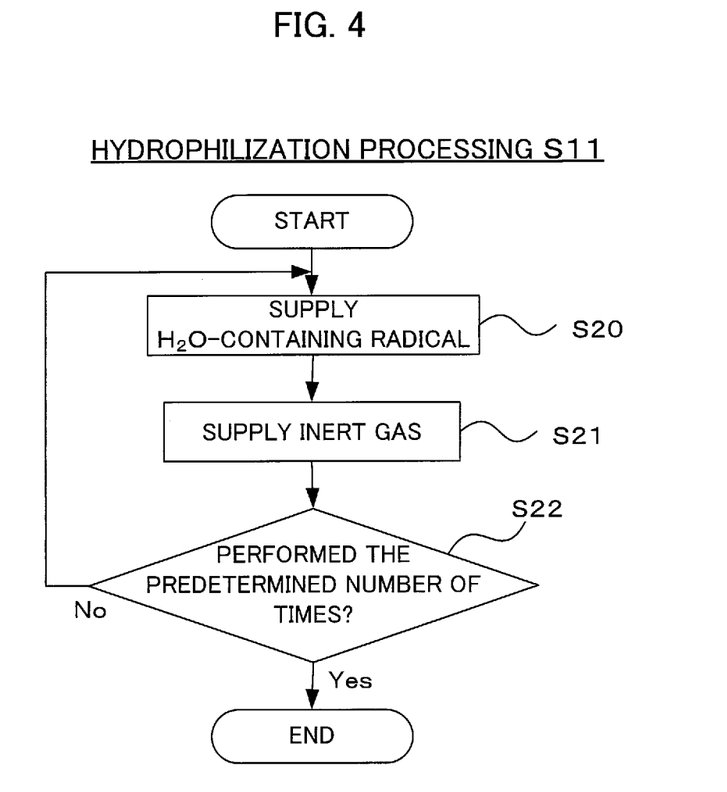
FIG. 4 is a flowchart illustrating a hydrophilization processing according to an embodiment of the present disclosure.

In this step, in the inert gas supply (S21) of the hydrophilization processing (S11) described in detail in FIG. 4 described above, the $N_2$ gas as the inert gas supplied from the third gas supply pipe 245a is heated by the gas heating device 253 and the pipe heater and supplied into the process space 205. That is, a hot gas is supplied to the wafer W by controlling the gas heating device 253. By colliding molecules of the hot gas with the $N_2$ gas as the inert gas and supplying the molecules, energy can be given to $H_2O$ molecules and $H_2O$ radicals adsorbed on the wafer W, and reaction of the $H_2O$ molecules and the $H_2O$ radicals adsorbed on the wafer W can be promoted. Instead of supplying the hot gas, the wafer W may be irradiated with an electromagnetic wave such as an infrared ray.

(Performing the Predetermined Number of Times: Step S32)

The above-described Steps S30 to S31 are defined as one cycle, and this cycle is repeated the predetermined number of times, preferably a plurality of times (performed alternately), so that the OH termination can be uniformly formed on the wafer W, that is, on the surface of the wafer W. Then, the Si precursor included in the $SiCl_4$ gas in the $SiCl_4$ gas supply of the subsequent SiO film forming process is easily adsorbed on the surface of the wafer W, such that the processing gas may be uniformly adsorbed on the surface of the wafer W having a high aspect ratio, thereby forming the SiO film uniformly.

Other Embodiments

The embodiments of the present disclosure have been specifically described above. However, the present disclosure is not limited to the above-described embodiments, and may be variously changed without departing from the gist thereof.

In the above-described embodiments, the examples in which the processing gas including the $H_2O$-containing radicals are generated by using the $H_2$ gas and the $O_2$ gas to perform the hydrophilization processing are described, but the present disclosure is not limited thereto, and alternatively, instead of using the $H_2$ gas and the $O_2$ gas, for example, a processing gas including $H_2O$-containing radicals may be generated using water vapor ($H_2O$), hydrogen peroxide ($H_2O_2$), $H_2O$ radicals, or the like.

Further, in the above-described embodiments, a case where the $SiCl_4$ gas is used as the halogen element-containing gas, which is the precursor gas, has been described, but the present disclosure is not limited thereto, and hexachlorodisilane ($Si_2Cl_6$), octachlorotrisilane ($Si_3Cl_8$), monochlorosilane ($SiH_3Cl$), dichlorosilane ($SiH_2Cl_2$), trichlorosilane ($SiHCl_3$), pentachlorodisilane ($Si_2HCl_5$) gas, or the like may be used.

Further, a gas including a halogen element other than the Si-based element may be used, for example, titanium (Ti)-based titanium tetrachloride ($TiCl_4$) gas, titanium tetrabromide ($TiBr_4$) gas, titanium tetraiodide ($TiI_4$) gas, tantalum (Ta)-based tantalum pentachloride ($TaCl_5$) gas, molybdenum (Mo)-based molybdenum pentachloride ($MoCl_5$) gas, aluminum (Al)-based aluminum trichloride ($AlCl_3$) gas, tungsten (W)-based tungsten pentachloride ($WCl_5$) gas or tungsten hexachloride ($WCl_6$) gas, hafnium (Hf)-based hafnium tetrachloride ($HfCl_4$) gas, zirconium (Zr)-based zirconium tetrachloride ($ZrCl_4$) gas, or the like may be used.

Further, in the above-described embodiments, a case where the $O_3$ gas is used as the gas including the oxygen element as the reactant gas has been described, but the present disclosure is not limited thereto, and $O_2$ gas, $H_2O$, $H_2O_2$, or the like may be used.

Further, in the above-described embodiments, a case where the gas including the oxygen element is used as the reactant gas has been described, but the present disclosure is not limited thereto, and, for example, a gas including a nitrogen element such as ammonia ($NH_3$) may be used. Further, a gas including both the oxygen element and the nitrogen element may be used.

In other words, the present disclosure can be similarly applicable to a case where a silicon nitride film (SiN film), a silicon oxynitride film (SiON film), or the like is formed on the wafer W without being limited to the SiO film.

Further, in the above-described embodiments, a case where the first gas supply system to the fourth gas supply system are connected to one gas supply pipe 242 and each processing gas is supplied into the process space 205 by the gas supply pipe 242 has been described, but the present disclosure is not limited thereto, and the first gas supply system to the fourth gas supply system are connected to the lid 231 respectively, and the respective processing gases may be supplied from the respective gas supply pipes into the process space 205.

It is preferable that recipes used for substrate processing are individually provided according to processing contents and stored in the memory device 280c via an electric communication line or the external memory device 282. Then, when the substrate processing is started, it is preferable that the CPU 280a appropriately selects an appropriate recipe from a plurality of recipes stored in the memory device 280c according to contents of the substrate processing. This makes it possible to form films of various film types, composition ratios, film qualities, and film thicknesses with a single substrate processing apparatus with good reproducibility. Further, a burden on an operator can be reduced, and the process can be started quickly while avoiding an operation error.

The above-described recipes are not limited to a case where the recipes are newly created, and may be provided by, for example, changing an existing recipe already installed in the substrate processing apparatus. When the recipe is changed, the changed recipe may be installed in the substrate processing apparatus via an electric communication line or a recording medium on which the recipe is recorded. Further, the input device 281 of the existing substrate processing apparatus may be operated to directly change the existing recipe already installed in the substrate processing apparatus.

In the above-described embodiments, the example in which a film is formed using a single-wafer-type substrate processing apparatus that processes one or several substrates at a time has been described. The present disclosure is not limited to the embodiments described above, and can be suitably applied to, for example, a case where a film is formed using a batch-type substrate processing apparatus that processes a plurality of substrates at a time.

Even when these substrate processing apparatuses are used, the substrate processing can be performed under the same processing procedures and processing conditions as those of the above-described embodiments and modifications, and the same effects may be obtained.

In addition, the above-described embodiments and modifications can be used in appropriate combinations. The processing procedure and processing conditions at this time can be the same as the processing procedures and processing conditions of the above-described embodiments, for example.

Hereinafter, examples will be described.

Examples

Figure 8:
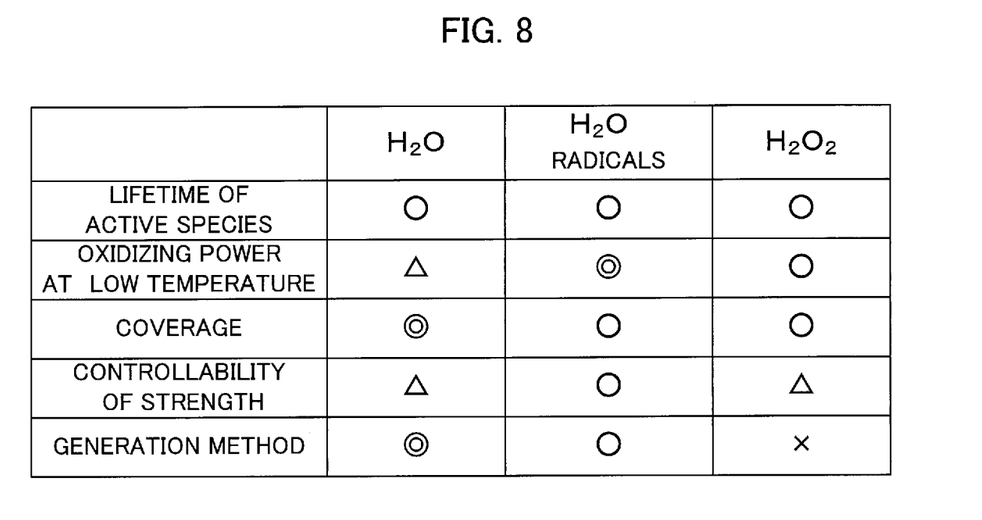
FIG. 8 is a diagram illustrating a comparison among evaluation results of gases used for the hydrophilization processing.

FIG. 8 is a diagram illustrating a comparison of evaluation results of the gas used for the hydrophilization processing.

Specifically, when the $H_2O$ gas, the $H_2O$ radical gas, and the $H_2O_2$ gas are used as the processing gas in the hydrophilization processing of the above-described substrate processing process, a lifetime of each active species, an oxidizing power at low temperature, coverage (step coverage), a controllability of strength of the oxidizing power and a gas generation method were compared.

The lifetime of the active species are not different among a case where the $H_2O$ gas is used, a case where the $H_2O$ radical gas is used, and a case where the $H_2O_2$ gas is used. The oxidizing power at the low temperature is strongest when the $H_2O$ radical gas is used, and second strongest when the $H_2O_2$ gas is used. When the $H_2O$ gas is used, the oxidizing power is weaker than that of the $H_2O$ radical gas or the $H_2O_2$ gas. The coverage was best when the $H_2O$ gas was used, and there was no difference between when the $H_2O$ radical gas was used and when the $H_2O_2$ gas was used. The controllability of strength of the oxidizing power is best when the $H_2O$ radical gas is used because the strength may be controlled by a flow rate of the gas. Since concentrations of the $H_2O$ gas and the $H_2O_2$ gas are determined, the controllability cannot be said to be good. As for the gas generation method, since $H_2O_2$ is usually in a liquid state and boiling points of $H_2O$ and $H_2O_2$ are different, gas generation cannot be said to be easy, but the $H_2O$ gas is easier in the gas generation than the $H_2O$ radical gas. That is, as shown by the evaluation results illustrated in FIG. 8, in order to form a high-quality film at a low temperature on a wafer having a high aspect ratio, it was confirmed that it was preferable to use the $H_2O$ radical gas as the processing gas used as the hydrophilization processing, as compared with the other processing gases.

What is claimed is:

1. A method of manufacturing a semiconductor device comprising:
    (a) supplying a processing gas comprising $H_2O$-containing radicals to a substrate;
    (b) supplying a gas comprising a halogen element to the substrate;
    (c) supplying a gas comprising one or both of an oxygen element and a nitrogen element to the substrate after (b);
    (d) repeating (b) and (c); and
    (e) repeating (a) and (d);
    wherein in (a), the supply of the processing gas and a supply of an inert gas are repeated.

2. The method according to claim 1, wherein (a) further comprises:
    generating an $H_2O$-containing gas using a vaporizer; and
    supplying the generated $H_2O$-containing gas to a plasma generator to generate the $H_2O$-containing radicals.

3. The method according to claim 1, wherein in (a), the supply of the processing gas and a heating of the substrate are alternately performed.

4. The method according to claim 2, wherein the vaporizer comprises a bubbler configured to bubble a liquid including $H_2O$, and
    the $H_2O$-containing gas is generated by bubbling.

5. The method according to claim 2, wherein the vaporizer is configured to generate the $H_2O$-containing gas by reacting a hydrogen-containing gas and an oxygen-containing gas in a high-temperature environment.

6. The method according to claim 3, wherein the heating of the substrate is performed by irradiating the substrate with infrared light.

7. The method according to claim 3, wherein the heating of the substrate is performed by supplying a heated inert gas.

8. The method according to claim 1, wherein in (a), the processing gas is adsorbed by self-limiting.

9. The method according to claim 1, wherein in (d), (a) is performed before (b).

10. The method according to claim 1, wherein in (e), after (a), (d) is performed n times; and
    (f) after (e), (a) is performed and the (d) is performed m times.

11. The method according to claim 1, wherein (e) is performed until (d) is performed n times, and
    wherein after the n times, (d) is performed the predetermined number of times without (e) being performed.

12. A substrate processing apparatus comprising:
    a vaporizer configured to vaporize a liquid source;
    a plasma generator configured to generate the $H_2O$-containing radicals by plasma-exciting the $H_2O$-containing gas vaporized by the vaporizer;
    a processing gas supply system configured to supply at least one selected from the group of a processing gas comprising the $H_2O$-containing radicals generated by the plasma generator and a gas comprising one or both of an oxygen element and a nitrogen element to a substrate; and
    a controller configured to be able to control the vaporizer, the plasma generator and the processing gas supply system so as to perform a process comprising:
    (a) supplying the processing gas to a substrate;
    (b) supplying the gas comprising a halogen element to the substrate;
    (c) supplying the gas comprising one or both of an oxygen element and a nitrogen element to the substrate after (b);
    (d) repeating (b) and (c); and
    (e) repeating (a) and (d);
    wherein in (a), the supply of the processing gas and a supply of an inert gas are repeated.

13. The apparatus according to claim 12, wherein the vaporizer comprises a bubbler configured to bubble a liquid including $H_2O$.

14. The apparatus according to claim 12, wherein the vaporizer is configured to generate the $H_2O$-containing gas by reacting a hydrogen-containing gas and an oxygen-containing gas in a high-temperature environment.

15. The apparatus according to claim 12, wherein a heater configured to irradiate the substrate with infrared light is provided.

16. A non-transitory computer-readable recording medium storing a program that causes a computer to cause a substrate processing apparatus to perform a process comprising:
    (a) supplying a processing gas comprising $H_2O$-containing radicals to a substrate;
    (b) supplying a gas comprising a halogen element to the substrate;
    (c) supplying a gas comprising one or both of an oxygen element and a nitrogen element to the substrate after (b);

(d) repeating (b) and (c); and
(e) repeating (a) and (d);
wherein in (a), the supply of the processing gas and a supply of an inert gas are repeated.

17. The medium according to claim 16, wherein (a) further comprises:
generating an $H_2O$-containing gas using a vaporizer; and
supplying the generated $H_2O$-containing gas to a plasma generator to generate the $H_2O$-containing radicals.

18. The method according to claim 1,
wherein the substrate includes a silicon-containing layer on a surface,
wherein in (a), the surface of the substrate is modified to be OH-terminated,
wherein in (b), a silicon-containing layer containing at least one selected from the group of a silicon, an oxygen, and a chlorine is formed on the surface of the substrate, and
wherein in (c), a layer comprising one or both of a silicon oxide layer and a silicon nitride layer is formed on the surface of the substrate.

19. The method according to claim 1, wherein the gas comprising a halogen element is a gas comprising a silicon element and a halogen element.

\* \* \* \* \*